US012772609B2

(12) United States Patent
Hyun

(10) Patent No.: US 12,772,609 B2
(45) Date of Patent: Oct. 20, 2026

(54) LIGHT EMITTING DISPLAY APPARATUS

(71) Applicant: LG Display Co., Ltd., Seoul (KR)

(72) Inventor: MyeongHak Hyun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 432 days.

(21) Appl. No.: 18/476,147

(22) Filed: Sep. 27, 2023

(65) Prior Publication Data

US 2024/0222551 A1 Jul. 4, 2024

(30) Foreign Application Priority Data

Dec. 28, 2022 (KR) ........................ 10-2022-0187543

(51) Int. Cl.
*H10H 20/814* (2025.01)
*H10H 20/84* (2025.01)
*H10H 20/857* (2025.01)
*H10W 90/00* (2026.01)

(52) U.S. Cl.
CPC .......... *H10H 20/814* (2025.01); *H10H 20/84* (2025.01); *H10H 20/857* (2025.01); *H10W 90/00* (2026.01)

(58) Field of Classification Search
CPC .... H10H 20/814; H10H 20/84; H10H 20/857; H10W 90/00
See application file for complete search history.

(56) References Cited

U.S. PATENT DOCUMENTS 11,183,669 B2 11/2021 Lim et al.
2017/0117337 A1* 4/2017 Kimura .............. H10K 59/8722
2019/0165062 A1 5/2019 Heo
2019/0198805 A1 6/2019 Kim et al.
2019/0221769 A1* 7/2019 Qu ........................ H10K 71/231
2019/0379006 A1 12/2019 Lim et al.
2020/0185650 A1* 6/2020 Lim ................. H10K 59/80515
2021/0351248 A1* 11/2021 Lee ....................... H10K 59/122
2022/0190042 A1* 6/2022 Ye ......................... H10K 59/122

FOREIGN PATENT DOCUMENTS

KR 10-2012-0004163 A 1/2012
KR 10-2019-0064198 A 6/2019
KR 10-2019-0075483 A 7/2019
KR 10-2019-0140348 A 12/2019

OTHER PUBLICATIONS

Ministry of Intellectual Property of Korea, Office Action, Korean Patent Application No. 10-2022-0187543, Jul. 1, 2026, 17 pages.

* cited by examiner

*Primary Examiner* — Anne M Hines
(74) *Attorney, Agent, or Firm* — Fenwick & West LLP

(57) ABSTRACT

A light emitting display apparatus includes a substrate including a display area and a non-display area at a periphery of the display area, a plurality of subpixels provided in the display area, and a blocking structure provided between the plurality of subpixels to reflect light incident from an emission region of the display area and prevent penetration of water between the plurality of subpixels.

20 Claims, 8 Drawing Sheets

LIGHT EMITTING DISPLAY APPARATUS

CROSS-REFERENCE TO RELATED APPLICATIONS

This application claims the benefit of the Korean Patent Application No. 10-2022-0187543 filed on Dec. 28, 2022, which is hereby incorporated by reference as if fully set forth herein.

BACKGROUND

Field of the Invention

The present disclosure relates to a light emitting display apparatus.

Discussion of the Related Art

Light emitting display apparatuses have a high response time and low power consumption and self-emit light without a separate light source unlike liquid crystal display (LCD) apparatuses, and thus, are attracting much attention as next-generation flat display apparatuses.

In light emitting display apparatuses, in order to implement a high resolution based on a large-sized screen, a light emitting device layer emitting white light is provided on a substrate, and red (R), green (G), and blue (B) color filters are disposed to respectively correspond to subpixels, thereby implementing an image. An emission region of each subpixel is divided by a bank, and an emission layer of the light emitting device layer is provided to cover the bank.

However, in light emitting display apparatuses of the related art, because emission layers provided in a plurality of subpixels are connected with one another to cover a bank, when a progressive defect such as a black spot occurs in a light emitting device layer due to oxygen or water, the progressive defect is diffused to an adjacent subpixel, causing a problem where the emission efficiency of a light emitting display apparatus is reduced.

SUMMARY

Accordingly, the present disclosure is directed to providing a light emitting display apparatus that substantially obviates one or more problems due to limitations and disadvantages of the related art.

An aspect of the present disclosure is directed to providing a light emitting display apparatus which may prevent a progressive defect, such as a black spot occurring in a light emitting device layer, from being diffused to an adjacent subpixel, may enhance the emission efficiency of the light emitting display apparatus, and may be driven with low power.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

A light emitting display apparatus includes a substrate including a display area and a non-display area at a periphery of the display area, a plurality of subpixels provided in the display area, and a blocking structure provided between the plurality of subpixels to reflect light incident from an emission region of the display area and prevent penetration of water between the plurality of subpixels.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

A light emitting display apparatus according to the present disclosure may prevent a progressive defect, such as a black spot occurring in a light emitting device layer, from being diffused to an adjacent subpixel, may enhance the emission efficiency of the light emitting display apparatus, and may be driven with low power.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
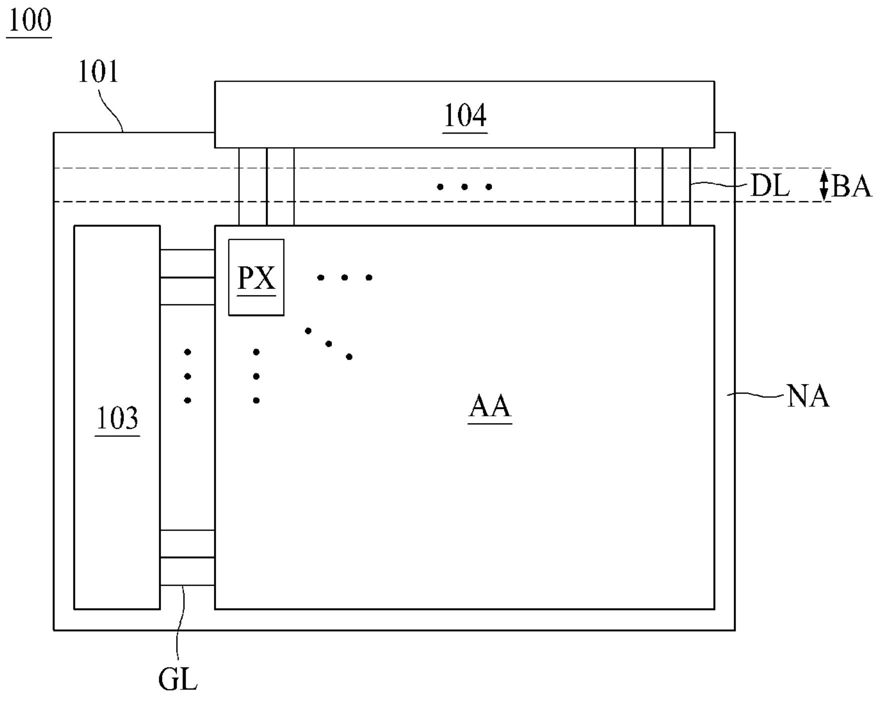
FIG. 1 is a diagram schematically illustrating a light emitting display apparatus according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When “comprise,” “have,” and “include” described in the present specification are used, another part may be added unless “only” is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, “on,” “over,” “under,” and “next,” one or more other parts may be disposed between the two parts unless a more limiting term, such as “just” or “direct(ly)” is used.

In describing a time relationship, for example, when the temporal order is described as, for example, “after,” “subsequent,” “next,” and “before,” a case that is not continuous may be included unless a more limiting term, such as “just,” “immediate(ly),” or “direct(ly)” is used.

It will be understood that, although the terms “first,” “second,” etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms “first,” “second,” “A,” “B,” “(a),” “(b),” etc. may be used. These terms are intended to identify the corresponding elements from the other elements, and basis, order, or number of the corresponding elements should not be limited by these terms. The expression that an element is “connected,” “coupled,” or “adhered” to another element or layer the element or layer can not only be directly connected or adhered to another element or layer, but also be indirectly connected or adhered to another element or layer with one or more intervening elements or layers “disposed,” or “interposed” between the elements or layers, unless otherwise specified.

The term “at least one” should be understood as including any and all combinations of one or more of the associated listed items. For example, the meaning of “at least one of a first item, a second item, and a third item” denotes the combination of all items proposed from two or more of the first item, the second item, and the third item as well as only one of the first item, the second item, and the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a display apparatus according to the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a diagram schematically illustrating a light emitting display apparatus according to the present disclosure.

Referring to FIG. 1, a display apparatus 100 according to an embodiment of the present disclosure may include a display panel 101. The display panel 101 may include a display area AA where a plurality of subpixels PX are provided and a non-display area NA which is disposed at a periphery of the display area AA.

Each subpixel PX of the display area AA may include a thin film transistor (TFT) which uses an oxide semiconductor material as an active layer.

A plurality of data lines DL and a plurality of gate lines GL may be arranged in the display area AA. For example, the plurality of data lines DL may be arranged in rows or columns, and the plurality of gate lines GL may be arranged in rows or columns. Also, the subpixel PX may be provided in an area defined by the data line DL and the gate line GL.

The plurality of gate lines GL may include a plurality of scan lines and a plurality of emission control lines. The plurality of scan lines and the plurality of emission control lines may transfer different kinds of signals (for example, a scan signal and an emission control signal) to gate nodes of different kinds of transistors (for example, a scan transistor and an emission control transistor) disposed in the subpixel PX.

At least one of a data driver 104 and a gate driver 103 may be disposed in the non-display area NA. Also, the non-display area NA may further include a bending region BA where a substrate of the display panel 101 is bent, but embodiments of the present disclosure are not limited thereto. For example, the bending region BA may be provided in the display area AA.

The gate driver 103 may include a TFT which is directly formed on the substrate of the display panel 101. For example, the gate driver 103 may include a TFT including a polycrystalline silicon semiconductor layer, a TFT including an oxide semiconductor layer, or the TFT including the polycrystalline silicon semiconductor layer and the TFT including the oxide semiconductor layer, which are paired. In a case where TFTs respectively disposed in the non-display area NA and the display area AA includes the same semiconductor material, the TFTs respectively disposed in the non-display area NA and the display area AA may be simultaneously performed in the same process.

In the TFT including the polycrystalline silicon semiconductor layer and the TFT including the oxide semiconductor layer, electron mobility may be high in a channel, and thus, a high resolution and low power may be implemented.

The gate driver 103 may supply a scan signal having a gate-on voltage to the plurality of gate lines GL sequentially or in a predetermined order, and thus, may drive pixel rows of the display area AA sequentially or in a predetermined order. Here, the gate driver 103 may be referred to as a scan driver. Here, the pixel row may denote a row which is configured with pixels connected to one gate line. As in the light emitting display apparatus according to an embodiment of the present disclosure, the gate driver 103 may be implemented as a gate in panel (GIP) type and may be directly disposed on the substrate of the display panel 101. The gate driver 103 may include a shift register and a level shifter.

The gate driver 103 may include a scan driving circuit which outputs scan signals to a plurality of scan lines corresponding to one kind of the gate line GL and an emission driving circuit which outputs emission control signals to the plurality of emission control lines corresponding to the other kind of the gate line GL.

The display apparatus 100 according to an embodiment of the present disclosure may further include the data driver 104. Also, the data driver 104 may convert image data into analog data voltages, and when a specific gate line is driven by the gate driver 103, the data driver 104 may supply the data voltages to the plurality of data lines DL.

The data line DL may be disposed to pass through the bending region BA, and various data lines DL may be disposed and may be connected with the data driver 104 through a data pad.

The bending region BA may be a region where the substrate of the display panel 101 is bent. The substrate of the display panel 101 may maintain a flat state in a region except the bending region BA.

Figure 2:
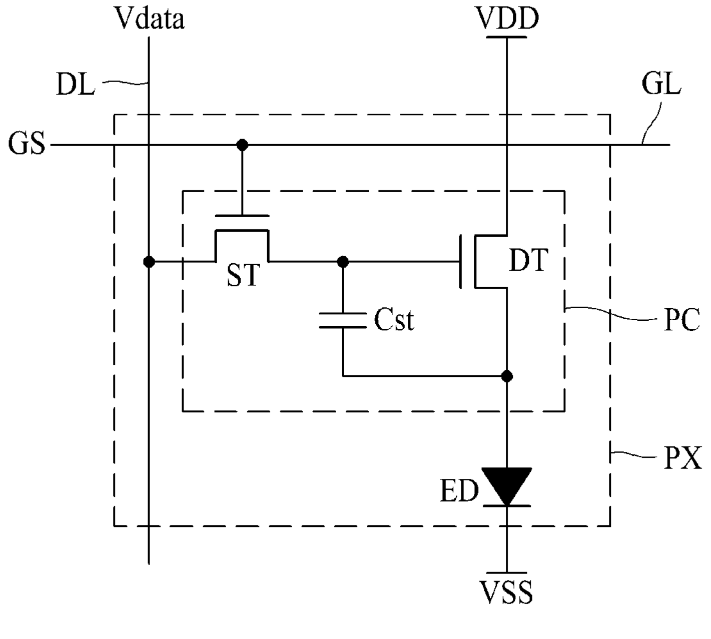
FIG. 2 is an equivalent circuit diagram illustrating a pixel illustrated in FIG. 1.

FIG. 2 is an equivalent circuit diagram illustrating a pixel illustrated in FIG. 1.

Referring to FIG. 2, each subpixel PX of a light emitting display apparatus according to an embodiment of the present disclosure may include a pixel circuit PC and a light emitting device ED.

The pixel circuit PC may be provided in a circuit region of a pixel area defined by a gate line GL and a data line DL and may be connected with an adjacent gate line GL, an adjacent data line DL, and a first driving power source VDD. The pixel circuit PC may control the emission of light from the light emitting device ED with a data voltage Vdata from the data line DL in response to a gate-on signal GS from the gate line GL. The pixel circuit PC according to an embodiment may include a switching TFT ST, a driving TFT DT, and a capacitor Cst.

The switching TFT ST may include a gate electrode connected with the gate line GL, a first source/drain electrode connected with the data line DL, and a second source/drain electrode connected with a gate electrode of the driving TFT DT. The switching TFT ST may be turned on based on the gate-on signal GS supplied through the gate line GL and may supply the data voltage Vdata, supplied through the data line DL, to the gate electrode of the driving TFT DT.

The driving TFT DT may include a gate electrode connected with the second source/drain electrode of the switching TFT ST, a first source/drain electrode (or a drain electrode) connected with the first driving power source VDD, and a second source/drain (or a source electrode) connected with the light emitting device ED. The driving TFT DT may be turned on with a gate-source voltage based on the data voltage Vdata supplied from the switching TFT ST and may control a data signal supplied from the first driving power source VDD to the light emitting device ED.

The capacitor Cst may be connected between the gate electrode and the source electrode of the driving TFT DT, may store a voltage corresponding to the data voltage Vdata supplied to the gate electrode of the driving TFT DT, and may turn on the driving TFT DT with the stored voltage. At this time, the capacitor Cst may maintain the turn-on state of the driving TFT DT until the data voltage Vdata is supplied thereto through the switching TFT ST in a next frame.

The light emitting device ED may be provided in an emission region of the pixel area and may emit light, based on a data signal supplied from the pixel circuit PC. For example, the light emitting device ED may include a first electrode connected with the source electrode of the driving TFT DT, a second electrode connected with a second driving power source VSS, and an emission layer provided between the first electrode and the second electrode. Here, the emission layer may include one of an organic emission layer, an inorganic emission layer, and a quantum dot emission layer, or may include a stack or combination structure of an organic emission layer (or an inorganic emission layer) and a quantum dot emission layer.

As described above, each subpixel PX of the light emitting display apparatus according to an embodiment of the present disclosure may control the data signal supplied to the light emitting device ED with a gate-source voltage of the driving TFT DT based on the data voltage Vdata to allow the light emitting device ED to emit light, thereby displaying a certain image.

Figure 3:
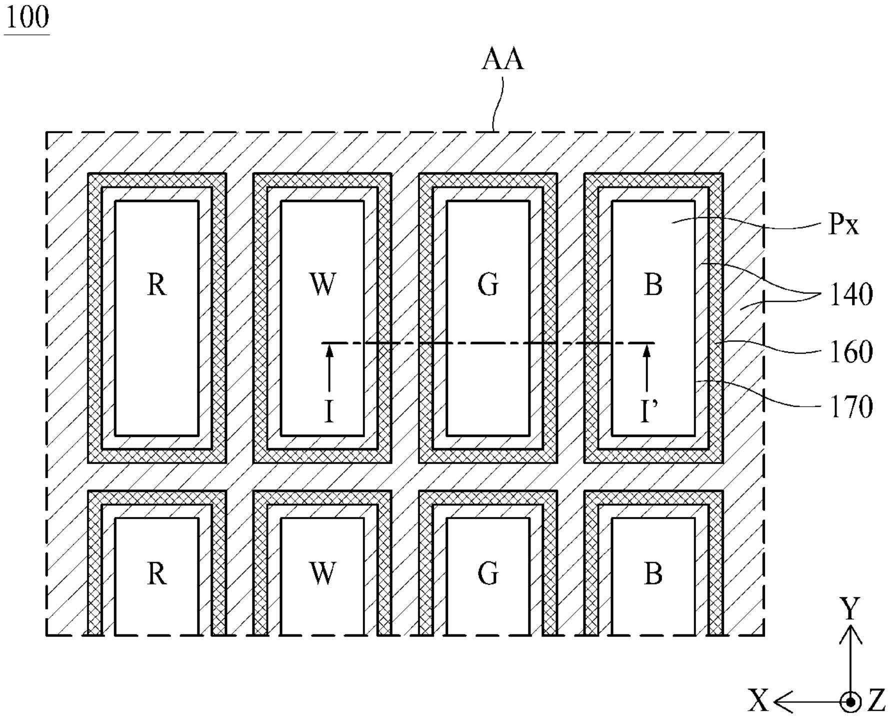
FIG. 3 is a plan view illustrating a structure of a pixel according to an embodiment of the preset disclosure.
Figure 4:
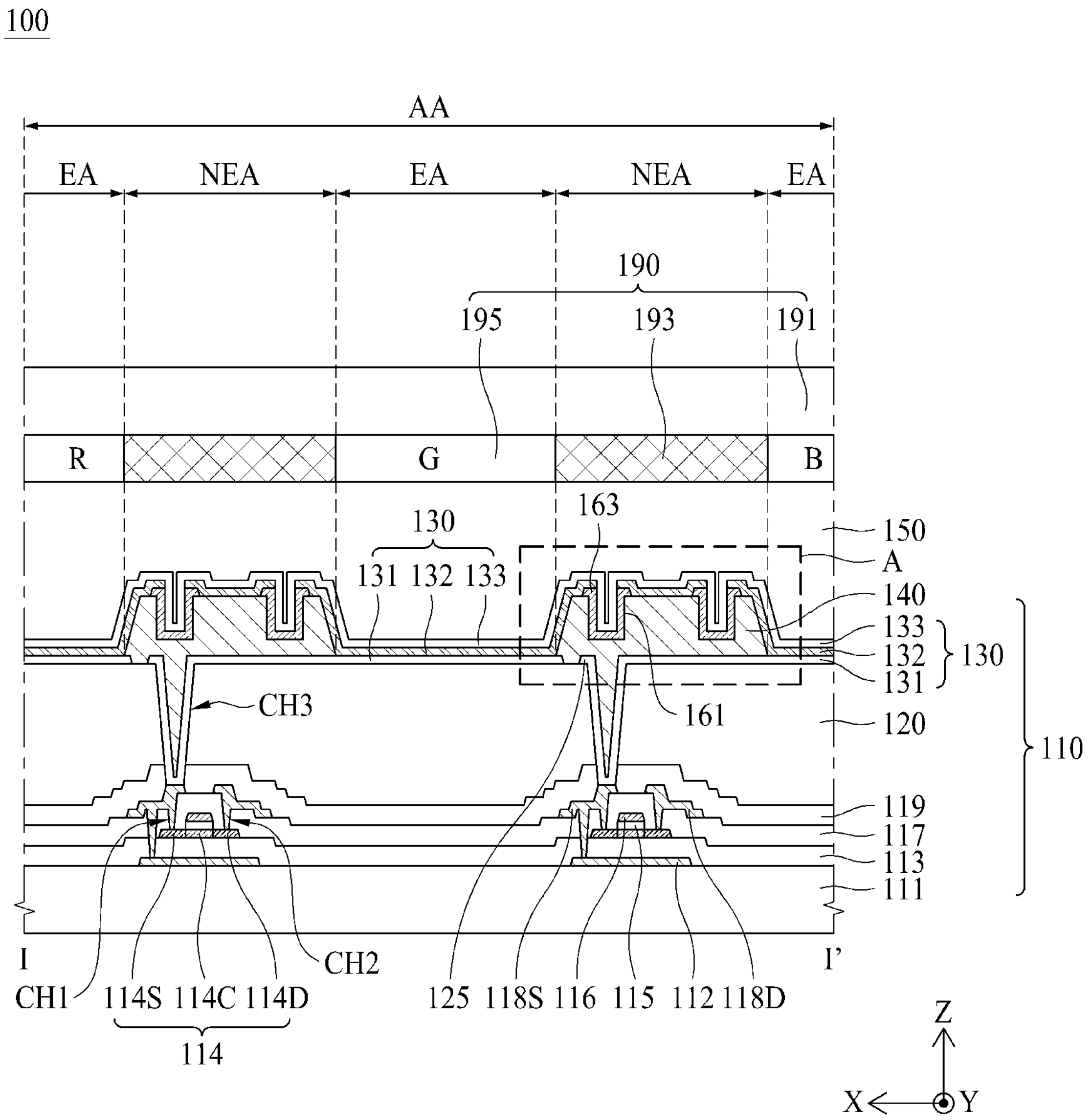
FIG. 4 is a cross-sectional view illustrating a structure of a pixel according to an embodiment of the preset disclosure.
Figure 5:
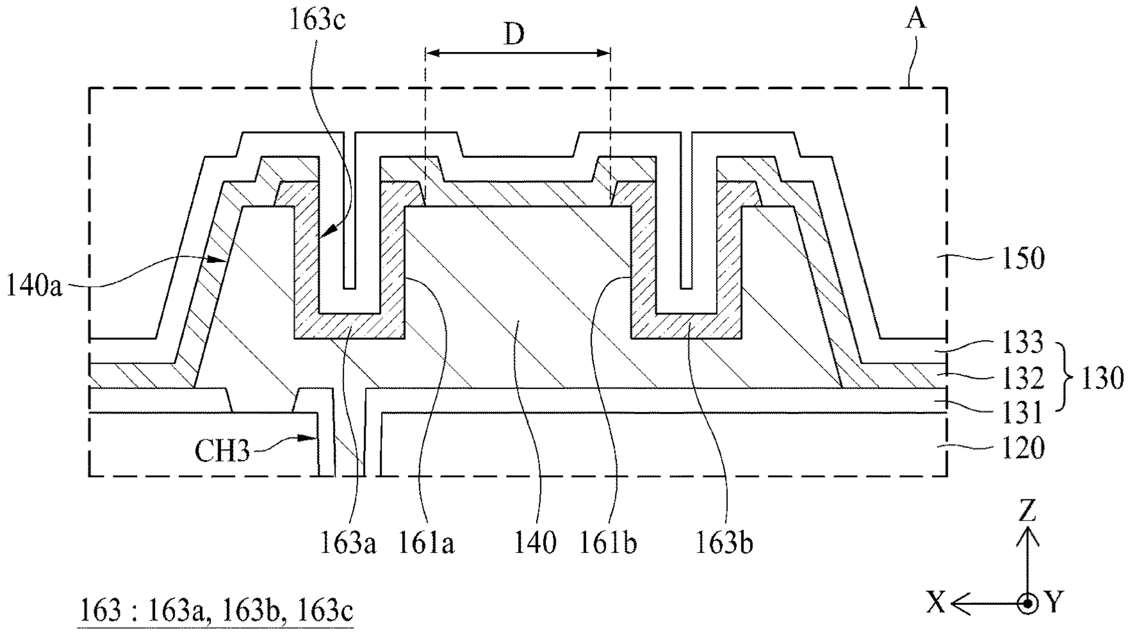
FIG. 5 is an enlarged view of a region A of FIG. 4.

FIG. 3 is a plan view illustrating a structure of a pixel according to an embodiment of the preset disclosure. FIG. 4 is a cross-sectional view illustrating a structure of a pixel according to an embodiment of the preset disclosure. FIG. 5 is an enlarged view of a region A of FIG. 4. FIG. 4 is a cross-sectional view illustrating a cross-sectional surface taken along line I-I' of FIG. 3.

Referring to FIGS. 3 to 5, a light emitting display apparatus 100 according to an embodiment of the present disclosure may include a TFT substrate 110 and a color filter substrate 190.

The TFT substrate 110 may include a lower substrate 111, a light blocking layer 112, a buffer layer 113, an active layer 114, a gate insulation layer 115, a gate electrode 116, a lower insulation layer 117, a source electrode 118S and a drain electrode 118D, an upper insulation layer 119, an overcoat layer 120, a light emitting device layer 130, and a bank 140. For example, the light emitting display apparatus 100 according to an embodiment of the present disclosure may be a light emitting display apparatus of a top emission type.

The lower substrate 111 may include a plurality of subpixels PX each including an emission region EA and a non-emission region NEA. The lower substrate 111 may include a glass material, but is not limited thereto and may include a transparent plastic material (for example, a polyimide material) capable of being curved or bent. In a case where a plastic material is used as a material of the lower substrate 111, polyimide which is excellent in heat resistance for enduring a high temperature may be used based on that a high temperature deposition process is performed on the lower substrate 111.

The light blocking layer 112 may be provided between the lower substrate 111 and the active layer 114. The light blocking layer 112 may block light which is incident on the active layer 114 through the lower substrate 111, and thus, may minimize or prevent a threshold voltage variation of a transistor caused by external light. Optionally, the light blocking layer 112 may be electrically connected with the drain electrode 118D of a transistor to function as a lower gate electrode of a corresponding transistor, and in this case, may minimize or prevent a threshold voltage variation of a transistor caused by a bias voltage, in addition to a change in characteristic caused by light.

The buffer layer 113 may be provided on the lower substrate 111. The buffer layer 113 may cover all of an upper surface and a lateral surface of the light blocking layer 112. The buffer layer 113 may block the diffusion of a material of the lower substrate 111 to a transistor layer in performing a high temperature process in a manufacturing process of a TFT. Also, the buffer layer 113 may prevent external water or moisture from penetrating into a light emitting device. For example, the buffer layer 113 may include silicon oxide or silicon nitride. For example, the buffer layer 113 may include silicon oxide, silicon nitride, or a structure where silicon oxide and silicon nitride are alternately stacked.

The active layer 114 may be provided on the buffer layer 113. The active layer 114 may be provided in the non-emission region NEA of the lower substrate 111. The active layer 114 may include a channel region 114C, and a drain region 114D and a source region 114S provided at both sides of the channel region 114C. That is, the active layer 114 may include the drain region 114D and the source region 114S, which have conductivity based on an etching gas in performing an etching process on the gate insulation layer 115, and the channel region 114C which does not have conductivity. In this case, the drain region 114D and the source region 114S may be disposed apart from each other in parallel with the channel region 114C therebetween. For example, the active layer 114 may include a semiconductor material consisting of one of amorphous silicon, polycrystalline silicon, oxide, and an organic material.

The gate insulation layer 115 may be provided on the channel region 114C of the active layer 114. The gate insulation layer 115 may be formed in an island shape on only the channel region 114C of the active layer 114 and may be formed on a whole front surface of the buffer layer 113 or the lower substrate 111 including the active layer 114.

The gate electrode 116 may be provided on the gate insulation layer 115 to overlap the channel region 114C of the active layer 114. The gate electrode 116 may function as a mask which allows the channel region 114C of the active layer 114 not to have conductivity caused by an etching gas in performing a patterning process of the gate insulation layer 115 by using an etching process. For example, the gate electrode 116 may include molybdenum (Mo), aluminum (Al), chromium (Cr), gold (Au), titanium (Ti), nickel (Ni), neodymium (Nd), copper (Cu), or an alloy thereof and may include a single layer or a two or more-layer multilayer, which includes the metal or alloy.

The lower insulation layer 117 may be provided on the lower substrate 111. The lower insulation layer 117 may be provided on the buffer layer 113 to cover the gate electrode 116. The lower insulation layer 117 may be provided over the gate electrode 116 and the drain region 114D and source drain region 114S of the active layer 114. For example, the lower insulation layer 117 may include an inorganic material such as silicon oxide (SiOx) or silicon nitride (SiNx). For example, the lower insulation layer 117 may include an organic material such as benzocyclobutene or photo acryl.

The source electrode 118S may be connected with the source region 114S of the active layer 114 through a first contact hole CH1 provided through the lower insulation layer 117 overlapping the source region 114S.

The drain electrode 118D may be electrically connected with the drain region 114D of the active layer 114 through a second contact hole CH2 provided through the lower insulation layer 117 overlapping the drain region 114D of the active layer 114.

The source electrode 118S and the drain electrode 118D may include the same metal material. For example, the source electrode 118S and the drain electrode 118D may include Mo, Al, Cr, Au, Ti, Ni, Nd, Cu, or an alloy thereof and may include a single layer or a two or more-layer multilayer, which includes the metal or alloy.

Additionally, the non-emission region NEA may further include a switching TFT and a capacitor. The switching TFT may be provided in the non-emission region NEA to have the same structure as that of a driving TFT, and the capacitor may be provided in an overlap region between the gate electrode 116 and the source electrode 118S of the driving TFT overlapping each other with the lower insulation layer 117 therebetween.

The upper insulation layer 119 may be provided all over the lower substrate 111 to cover the TFT. That is, the upper insulation layer 119 may cover the source electrode 118S and the drain electrode 118D of the driving TFT and the lower insulation layer 117. For example, the upper insulation layer 119 may include an inorganic material such as SiOx or SiNx.

The overcoat layer 120 may be provided over the lower substrate 111. The overcoat layer 120 may be provided on the upper insulation layer 119. The overcoat layer 120 may planarize an upper surface of the lower substrate 111 including the TFT. For example, the overcoat layer 120 may include an organic layer such as polyimide or acrylic resin.

The light emitting device layer 130 may be provided on the overcoat layer 120. The light emitting device layer 130 may include a first electrode 131, an emission layer 132, and a second electrode 133.

The first electrode 131 may be provided on the overcoat layer 120. For example, the first electrode 131 may be connected with the source electrode 118S of the driving TFT through a third contact hole CH3. The third contact hole CH3 may be provided though the overcoat layer 120. For example, the first electrode 131 may be formed in a multi-layer structure which includes a transparent conductive layer and an opaque conductive layer having high reflection efficiency. The transparent conductive layer may include a material, having a relatively large work function value, such as indium-tin-oxide (ITO) or indium-zinc-oxide (IZO), and the opaque conductive layer may include a single-layer or multi-layer structure which includes Al, silver (Ag), Cu, lead (Pb), Mo, Ti, or an alloy thereof.

The bank 140 may be formed on the overcoat layer 120 to cover one side and the other side of the first electrode 131 of each subpixel PX. The bank 140 may divide an emission region of each subpixel PX. The bank 140 may be a pixel definition layer which defines an emission region of each subpixel PX. A groove 161 of a blocking structure 160 may be provided in the bank 140. For example, the bank 140 may include an opaque material so as to prevent light interference between adjacent subpixels PX. In this case, the bank 140 may include a light blocking material including at least one of a colored pigment, organic black, and carbon. The bank 140 may be disposed to correspond to a black matrix 193 of the color filter substrate 190 opposite thereto.

The blocking structure 160 may be provided between the plurality of subpixels PX. The blocking structure 160 may reflect light which is incident from the emission region EA of the display area AA. The blocking structure 160 may prevent the penetration of water or oxygen from one subpixel PX into the other adjacent subpixel PX. The blocking structure 160 according to an embodiment of the present disclosure may be provided at the bank 140. The blocking structure 160 may include a groove 161 and a reflection layer 163. The groove 161 may be provided between the plurality of subpixels PX. The groove 161 may be provided as one or more between the plurality of subpixels PX. The groove 161 may be provided in the bank 140. The groove 161 may be provided to be concave in a direction from an upper surface of the bank 140 to a lower surface of the bank 140. For example, the groove 161 may be a slit, a recessed portion, or a concave portion.

As in FIG. 3, the blocking structure 160 may be provided at a perimeter of each of the plurality of subpixels PX. Therefore, the groove 161 may be provided at the perimeter of each of the plurality of subpixels PX. For example, the groove 161 may be provided to surround each of the plurality of subpixels PX, but embodiments of the present disclosure are not limited thereto.

A lateral surface of the groove 161 may be implemented to be vertical in a direction from the upper surface of the bank 140 to the lower surface of the bank 140. For example, the light emitting display apparatus according to an embodiment of the present disclosure may include two grooves 161 provided between a plurality of subpixels. The two grooves 161 may include a first groove 161*a* and a second groove 161*b*. Each of the first groove 161*a* and the second groove 161*b* may be arranged in parallel with the bank 140. Each of the first groove 161*a* and the second groove 161*b* may be provided in parallel in a first direction (for example, a Y-axis direction) in which the bank is formed. For example, the first direction may be a length direction. The first groove 161*a* and the second groove 161*b* may be disposed apart from each other. The first groove 161*a* and the second groove 161*b* may not contact each other. A separation distance between the first groove 161*a* and the second groove 161*b* may be variously set within a width range of the bank 140, based on a path of light emitted from the light emitting device layer 130.

The reflection layer 163 may be provided on the groove 161. The reflection layer 163 may be provided on the groove 161 and may be disposed at the perimeter of each of the plurality of subpixels PX. For example, the reflection layer 163 may be provided to surround the perimeter of each of the plurality of subpixels PX. However, embodiments of the present disclosure are not limited thereto. The reflection layer 163 may be provided on a lateral surface of the groove 161. The reflection layer 163 may reflect light incident from the emission region EA of the display area AA. Because the reflection layer 163 is provided between the plurality of subpixels PX, the reflection layer 163 may prevent water or oxygen from penetrating from one subpixel PX into the other subpixel PX. The reflection layer 163 may extend up to a lateral surface and a lower surface of the groove 161 from an upper surface of the bank 140. For example, the reflection layer 163 may be provided in a region, which is close to the groove 160, of the bank 140. For example, the reflection layer 163 may not be provided in a region, which is close to the emission region EA, of the upper surface of the bank 140. Therefore, light emitted from the emission layer 132 may be reflected by the reflection layer 163 and may irradiate in an upward direction. For example, the reflection layer 163 may not be provided at a lateral surface 140*a* of the bank 140 adjacent to the emission region EA. Accordingly, the lateral surface 140*a* of the bank 140 adjacent to the emission region EA may contact the emission layer 132. The reflection layer 163 may cover the groove 161. The reflection layer 163 may be apart from the first electrode 131 of the light emitting device layer 130. The reflection layer 163 may not be connected with the first electrode 131 of the light emitting device layer 130. The reflection layer 163 may not contact the first electrode 131. Therefore, in a subsequent process, even when the reflection layer 163 contacts the second electrode 133, short circuit may not occur because the reflection layer 163 does not contact the first electrode 131.

The light emitting display apparatus according to an embodiment of the present disclosure may include two reflection layers 163 provided between the plurality of subpixels PX. The two reflection layers 163 may include a first reflection layer 163*a* and a second reflection layer 163*b*. Each of the first reflection layer 163*a* and the second reflection layer 163*b* may be provided in parallel at the bank 140. The first reflection layer 163*a* and the second reflection layer 163*b* may be provided to respectively correspond to the first groove 161*a* and the second groove 161*b*. For example, the first reflection layer 163*a* may be provided on the first groove 161*a*, and the second reflection layer 163*b* may be provided on the second groove 161*b*. The first reflection layer 163*a* and the second reflection layer 163*b* may cover one side and the other side of an upper portion of the bank 140. For example, the first reflection layer 163*a* may cover the one side of the upper portion of the bank 140, and the second reflection layer 163*b* may cover the one side of the upper portion of the bank 140 and the other side of an upper portion of a different bank 140. The first reflection layer 163*a* and the second reflection layer 163*b* may be arranged in parallel in the first direction (for example, the Y-axis direction) in which the bank 140 is formed. The first reflection layer 163*a* and the second reflection layer 163*b* may be arranged apart from each other. A separation distance D between the first reflection layer 163*a* and the second reflection layer 163*b* may be set based on the separation distance between the first groove 161*a* and the second groove 161*b*. A reflection angle of light incident from the emission region EA of the display area AA may be variously set based on the separation distance D between the first reflection layer 163*a* and the second reflection layer 163*b*. For example, the reflection layer 163 may include a metal layer. For example, the reflection layer 163 may include a metal material having a high reflectance. For example, the reflection layer 163 may include a single-layer or multi-layer structure which includes Al, Ag, Cu, Pb, Mo, Ti, or an alloy thereof.

In an embodiment of the present disclosure, because the groove 161 and the reflection layer 163 are provided between the plurality of subpixels PX, light incident from the emission region EA of each subpixel PX may be reflected in a light traveling direction. In an embodiment of the present disclosure, because the groove 161 and the reflection layer 163 are provided between the plurality of subpixels PX, the penetration of water or oxygen between the plurality of subpixels PX may be prevented.

According to an embodiment of the present disclosure, the groove 161 and the reflection layer 163 may be provided to surround each of the plurality of subpixels PX. Therefore, in an embodiment of the present disclosure, when a progressive defect such as a black spot occurs in one subpixel PX, the diffusion of the progressive defect to an adjacent subpixel PX may be prevented. Therefore, in an embodiment of the present disclosure, the diffusion of the progressive defect may be prevented, and light incident from the light emitting device layer may be reflected in a light traveling direction, thereby preventing emission efficiency from being reduced by color coordinate distortion in a low gray level and the afterimage lifetime and light leakage of a light emitting display apparatus. Accordingly, in an embodiment of the present disclosure, a low power effect for power consumption may be implemented.

In another embodiment, the reflection layer 163 may have a stack structure including an inorganic layer and a metal layer. The inorganic layer may be provided on the groove 161. The metal layer may be provided on the inorganic layer. For example, the inorganic layer may include silicon oxide or silicon nitride. The metal layer may include a single-layer or multi-layer structure which includes Al, Ag, Cu, Pb, Mo, Ti, or an alloy thereof.

Therefore, in another embodiment of the present disclosure, the inorganic layer may additionally prevent the penetration of water or oxygen. Accordingly, in another embodiment of the present disclosure, the diffusion of the progressive defect may be better prevented, and the efficiency of a light emitting display apparatus may be more enhanced.

The emission layer 132 may be provided on the first electrode 131. The emission layer 132 may be provided on the bank 140. The emission layers 132 respectively provided in the plurality of subpixels may be apart from one another. For example, the emission layer 132 may be provided for each subpixel. The emission layer 132 may not be provided on a lower surface of the reflection layer 163. The emission layer 132 may not be provided in a space between one surface and the other surface of the groove 161. The emission layer 132 provided in each subpixel PX may be apart from an adjacent emission layer 132 with a groove therebetween.

For example, as the light emitting display apparatus includes a large-sized screen, manufacturing equipment has been enlarged in size. Therefore, the enlargement of metal mask equipment is required, and in a metal mask having a large area, there is a problem where it is difficult to implement a high resolution because sagging occurs in vacuum deposition. To solve such a problem, instead of a metal mask scheme which is difficult to implement a large-sized screen and a high resolution, a white light emitting display apparatus has been developed where an emission layer emitting white light is formed and an image is implemented by forming R, G, and B color filters by subpixel units. However, in the white light emitting display apparatus, because the emission layer is deposited on a whole surface of a display area of a substrate, when a progressive defect such as a black spot occurs in one subpixel PX, the progressive defect may be diffused to an adjacent subpixel, causing a reduction in efficiency.

In an embodiment of the present disclosure, because the blocking structure 160 including the groove 161 and the reflection layer 163 is provided to surround each of the plurality of subpixels PX at a perimeter of each of the plurality of subpixels PX, the emission layers 132 provided in the subpixels PX may be apart from one another without a separate mask process. Therefore, in an embodiment of the present disclosure, the bank 140 and the emission layer 132 including an organic material may prevent a progressive defect such as a black spot from being diffused to an adjacent subpixel PX. For example, in a case where the emission layer 132 connected with an adjacent emission layer 132 for each pixel is provided on the bank 140 including an organic material, a progressive defect occurring in one subpixel may be diffused to an adjacent pixel through the bank 140 and the emission layer 132. However, in an embodiment of the present disclosure, because the blocking structure 160 is provided at the bank 140 and the emission layers 132 respectively provided in a plurality of subpixels are apart from one another, light of a light emitting display apparatus may be reflected, and the diffusion of the progressive defect to an adjacent pixel may be prevented. Accordingly, the light emitting display apparatus according to an embodiment of the present disclosure may enhance emission efficiency and may decrease power consumption.

The second electrode 133 may be opposite to the first electrode 131 with the emission layer 132 therebetween and may be provided on an upper surface and a lateral surface of the emission layer 132. The second electrode 133 may be provided on the blocking structure 160. The second electrode 133 may be provided as one body on a whole surface of an active region, but embodiments of the present disclosure are not limited thereto. For example, the second electrode 133 may be provided along the groove 161 to overlap the groove 161. The second electrode 133 may be provided on the reflection layer 163 or at the lateral surface 163*c* of the reflection layer 163. For example, the second electrode 133 may contact the reflection layer 163, on the reflection layer 163 or at the lateral surface 163*c* of the reflection layer 163. In this case, in an embodiment of the present disclosure, because the second electrode 133 contacts the reflection layer 163, a resistance of the second electrode 133 may be additionally reduced.

The color filter substrate 190 may include an upper substrate 191, a color filter layer 195, and a black matrix 193.

The upper substrate 191 may be provided to be opposite to the lower substrate 111. The upper substrate 191 may include a glass material, but is not limited thereto and may include a transparent plastic material (for example, a polyimide material) capable of being curved or bent. In a case where a plastic material is used as a material of the upper substrate 191, polyimide which is excellent in heat resistance for enduring a high temperature may be used based on that a high temperature deposition process is performed on the upper substrate 191.

The color filter layer 195 may be provided under the upper substrate 191. The color filter layer 195 may be provided in each subpixel of the upper substrate 191. For example, the color filter layer 195 may include a red color filter, a green color filter, and a blue color filter respectively corresponding to subpixels. In an embodiment of the present disclosure, because white light is emitted from a white light emitting device layer 130, the color filter layer 195 which is patterned may be provided for each subpixel, and thus, a color image may be implemented.

The black matrix 193 may be provided under the upper substrate 191. The black matrix 193 may be provided at a boundary between adjacent subpixels. The black matrix 193 may be provided in the non-emission region NEA in each subpixel. The black matrix 193 may be provided to correspond to the bank 140. The black matrix 193 may be provided to face the bank 140. For example, a width of the black matrix 193 may be set to be less than that of the bank 140.

The black matrix 193 may be provided between color filters so that lights passing through color filters do not overlap each other or are not mixed. The black matrix 193 may divide an emission region of light passing through the color filter layer 195.

The light emitting display apparatus according to an embodiment of the present disclosure may further include a filling layer 150 and a dam (not shown).

The filling layer 150 may be provided between the TFT substrate 110 and the color filter substrate 190. In a case where the TFT substrate 110 is bonded to the color filter substrate 190, when a separate material is not filled into an empty space between the TFT substrate 110 and the color filter substrate 190, the light emitting display apparatus 100 may be vulnerable to water and oxygen penetrating from the outside thereof. Therefore, the filling layer 150 may be formed in the empty space between the TFT substrate 110 and the color filter substrate 190 and may prevent water and oxygen from penetrating into the display panel. For example, the filling layer 150 may include base resin and getter. The base resin may be a resin composition formed from a binder compound and may disperse getter. The filling layer 150 may be provided on the light emitting device layer 130.

The dam (not shown) may be provided between the TFT substrate 110 and the color filter substrate 190 in the non-display area NEA. The dam may be configured to surround the filling layer 150. The dam may be configured to contact each of the TFT substrate 110 and the color filter substrate 190. The dam may bond the TFT substrate 110 to the color filter substrate 190 to reinforce an adhesive force of the filling layer 150. The dam may prevent the penetration of water and oxygen through a lateral surface of the light emitting display apparatus 100. For example, the dam may be a member which seals elements between the TFT substrate 110 and the color filter substrate 190 and may be referred to as a sealant.

In the following description, only modified elements will be described in detail, and the other elements are referred to by the same reference numerals as FIGS. 3 to 5 and repeated descriptions thereof are omitted and will be briefly given.

Figure 6:
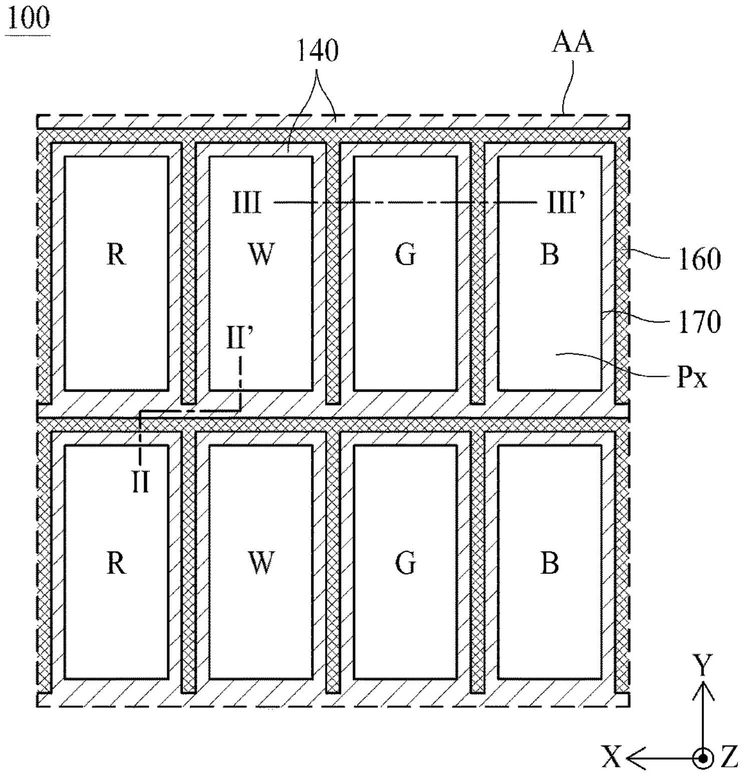
FIG. 6 is a plan view illustrating a structure of a pixel according to another embodiment of the preset disclosure.
Figure 7:
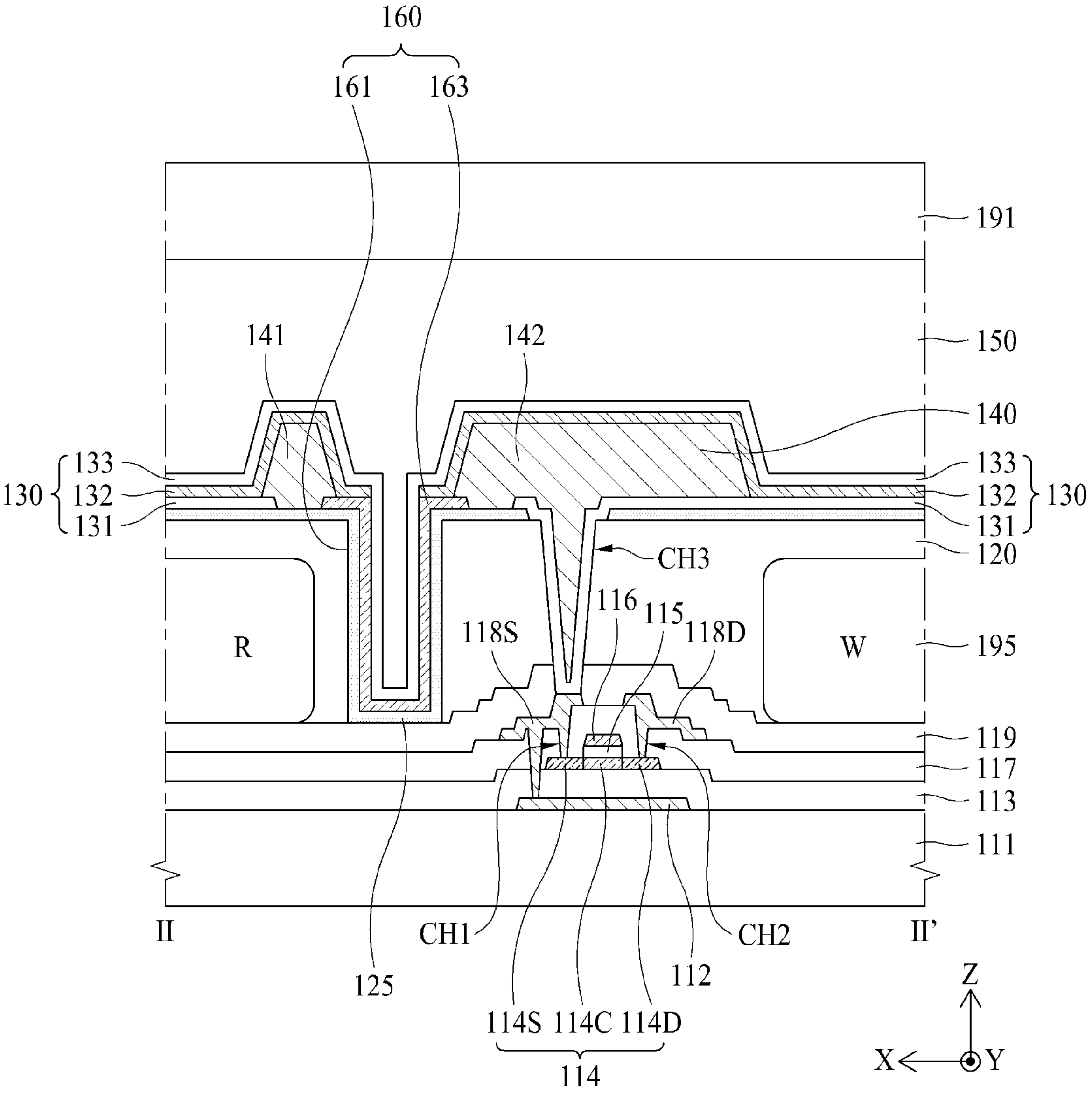
FIG. 7 is a cross-sectional view illustrating a cross-sectional surface taken along line II-II' of FIG. 6.
Figure 8:
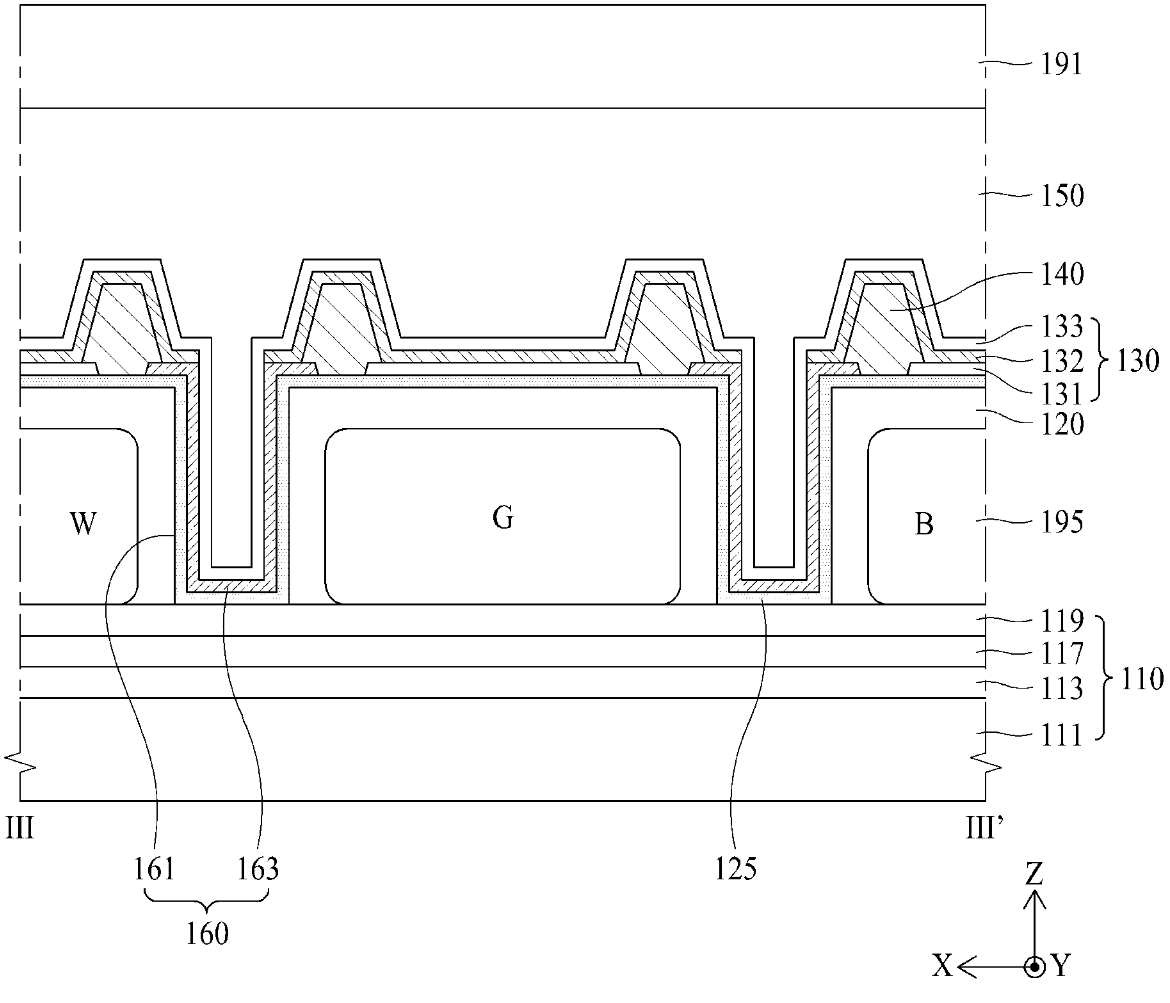
FIG. 8 is a cross-sectional view illustrating a cross-sectional surface taken along line III-III' of FIG. 6.

FIG. 6 is a plan view illustrating a structure of a pixel according to another embodiment of the preset disclosure. FIG. 7 is a cross-sectional view illustrating a cross-sectional surface taken along line II-II' of FIG. 6. FIG. 8 is a cross-sectional view illustrating a cross-sectional surface taken along line III-III' of FIG. 6. In another embodiment of the present disclosure, a blocking structure may be provided at an overcoat layer, and the other elements may be the same as an embodiment of the present disclosure described above with reference to FIGS. 3 to 5. Hereinafter, therefore, only different elements will be described.

Referring to FIGS. 6 to 8, a light emitting display apparatus 100 according to another embodiment of the present disclosure may include a lower substrate 111, a light blocking layer 112, a buffer layer 113, an active layer 114, a gate insulation layer 115, a gate electrode 116, a lower insulation layer 117, a source electrode 118S and a drain electrode 118D, an upper insulation layer 119, a color filter layer 195, an overcoat layer 120, an anti-moisture layer 125, a blocking structure (or antireflection layer) 160, a light emitting device layer 130, a bank 140, and an upper substrate 191. For example, another embodiment of the present disclosure may relate to a light emitting display apparatus of a bottom emission type. For example, light emitted from the light emitting device layer 130 according to another embodiment of the present disclosure may be irradiated toward the lower substrate 111. A TFT may be provided on the lower substrate 111, and the color filter layer 195 may be provided on the lower substrate 111.

The color filter layer 195 may be provided in each subpixel of the lower substrate 111. The color filter layer 195 may be provided on the upper insulation layer 119. In another embodiment of the present disclosure, because white light emitted from a white light emitting device layer 130 is discharged downward, the color filter layer 195 which is patterned may be provided for each subpixel, and thus, a color image may be implemented.

The overcoat layer 120 may be provided on the lower substrate 111. The overcoat layer 120 may be provided on the upper insulation layer 119 and the color filter layer 195. A groove 161 of the blocking structure 160 may be provided in the overcoat layer 120.

The blocking structure 160 may be provided between a plurality of subpixels PX. For example, the blocking structure 160 may be provided to surround a perimeter of each of the plurality of subpixels PX. For example, the blocking structure 160 may be provided to surround a portion of each of the plurality of subpixels PX. The blocking structure 160 may be provided between adjacent color filter layers 195. The blocking structure 160 may reflect light incident from an emission region of the display area. The blocking structure 160 may prevent the diffusion of water, oxygen, or hydrogen. The blocking structure 160 may include the groove 161 and the reflection layer 163.

The groove 161 may be provided to be concave in a direction from an upper surface of the overcoat layer 120 to a lower surface of the overcoat layer 120. For example, the groove 161 may be provided between a plurality of subpixels. A lateral surface of the groove 161 may be provided to be vertical in a direction (or a direction toward the lower substrate) from an upper surface of the bank 140 to a lower surface of the bank 140. For example, the groove 161 may be formed by a dry etching process. A width of the groove 161 may be within a range of about 3 μm to about 10 μm. The groove 161 may not overlap the bank 140. The groove 161 may be provided in a region, where the bank 140 is not provided, of the overcoat layer 120. The groove 161 may be provided between a first bank 141 and a second bank 142.

The anti-moisture layer 125 may be provided on the overcoat layer 120. The anti-moisture layer 125 may be provided on the groove 161. The anti-moisture layer 125 may be formed along the groove 161. The anti-moisture layer 125 may be provided to cover a lateral surface and a lower surface of the groove 161. The anti-moisture layer 125 may primarily prevent the penetration of water or oxygen moving to each subpixel PX. For example, the anti-moisture layer 125 may include silicon oxide or silicon nitride.

The light emitting display apparatus according to an embodiment of the present disclosure may include the anti-moisture layer 125, and thus, may prevent water or oxygen from penetrating into the light emitting device layer 130 from the lower substrate 111. Also, in an embodiment of the present disclosure, because the anti-moisture layer 125 is formed along the groove 161, when a progressive defect occurs in one subpixel PX, the diffusion of the progressive defect to an adjacent subpixel PX may be prevented.

The reflection layer 163 may be provided on the anti-moisture layer 125. The reflection layer 163 may be provided on the groove 161. The reflection layer 163 may be provided on a lateral surface of the groove 161. The reflection layer 163 may extend up to the lateral surface and a lower surface of the groove 161 from an end of an upper surface of the overcoat layer 120. The reflection layer 163 according to another embodiment of the present disclosure may be provided on the same layer as the first electrode 131. The reflection layer 163 may be apart from the first electrode 131. The reflection layer 163 may not contact the first electrode 131. Therefore, a first and a second end of the reflection layer 163 may be covered by the bank 140. For example, the reflection layer 163 may include a metal layer. For example, the reflection layer 163 may include a metal material having a high reflectance. For example, the reflection layer 163 may include a single-layer or multi-layer structure which includes Al, Ag, Cu, Pb, Mo, Ti, or an alloy thereof.

The light emitting device layer 130 may be provided on the overcoat layer 120. The light emitting device layer 130 may include a first electrode 131, an emission layer 132, and a second electrode 133. The first electrode 131 may be provided on the overcoat layer 120. The first electrode 131 may be apart from the reflection layer 163.

The bank 140 may be formed on the overcoat layer 120 to cover one side and the other side of the first electrode 131 of each subpixel. The bank 140 may divide an emission region EA of each subpixel PX. The bank 140 may be a pixel definition layer which defines the emission region EA of each subpixel PX.

The bank 140 according to another embodiment of the present disclosure may include a first bank 141 and a second bank 142. Each of the first bank 141 and the second bank 142 may be provided to cover an end of the first electrode 131 of an adjacent pixel. For example, the first bank 141 may cover a first end of the reflection layer 163 and a second end of the first electrode 131, and the second bank 142 may cover a second end, facing the first end, of the reflection layer and a first end of an adjacent first electrode of an adjacent subpixel. The first bank 141 may be apart from the second bank 142. The groove 161 may not overlap the first bank 141 and the second bank 142. The groove 161 may overlap a separation space between the first bank 141 and the second bank 142. The first bank 141 and the second bank 142 may be apart from each other with the groove 161 therebetween.

The emission layer 132 may be provided on the first electrode 131. The emission layer 132 may be provided over the bank 140. The emission layer 132 may cover the bank 140. The emission layers 132 respectively provided in the plurality of subpixels may be apart from one another by the blocking structure 160. For example, the emission layer 132 may be provided for each subpixel. For example, an emission layer 132 of a white subpixel may be apart from an emission layer 132 of a green subpixel.

In another embodiment of the present disclosure, because the emission layers 132 respectively provided in the plurality of subpixels are apart from one another and the blocking structure 160 is provided between the color filter layers 195 provided in the plurality of subpixels, a progressive defect such as a black spot occurring in a light emitting display apparatus of the bottom emission type may be prevented from being diffused to an adjacent pixel. Accordingly, the light emitting display apparatus according to an embodiment of the present disclosure may enhance emission efficiency and may decrease power consumption.

The second electrode 133 may be opposite to the first electrode 131 with the emission layer 132 therebetween and may be provided on an upper surface and a lateral surface of the emission layer 132. The second electrode 133 may be provided on the blocking structure 160, but embodiments of the present disclosure are not limited thereto. The second electrode 133 may be provided as one body on a whole surface of a display area AA, but embodiments of the present disclosure are not limited thereto. For example, the second electrode 133 may be provided along the groove 161 to overlap the groove 161. The second electrode 133 may be provided on the reflection layer 163 and at the lateral surface of the reflection layer 163. For example, the second electrode 133 may contact the reflection layer 163, on the reflection layer 163 or at the lateral surface of the reflection layer 163. Therefore, in an embodiment of the present disclosure, because the second electrode 133 contacts the reflection layer 163, a resistance of the second electrode 133 may be additionally reduced.

Figure 9:
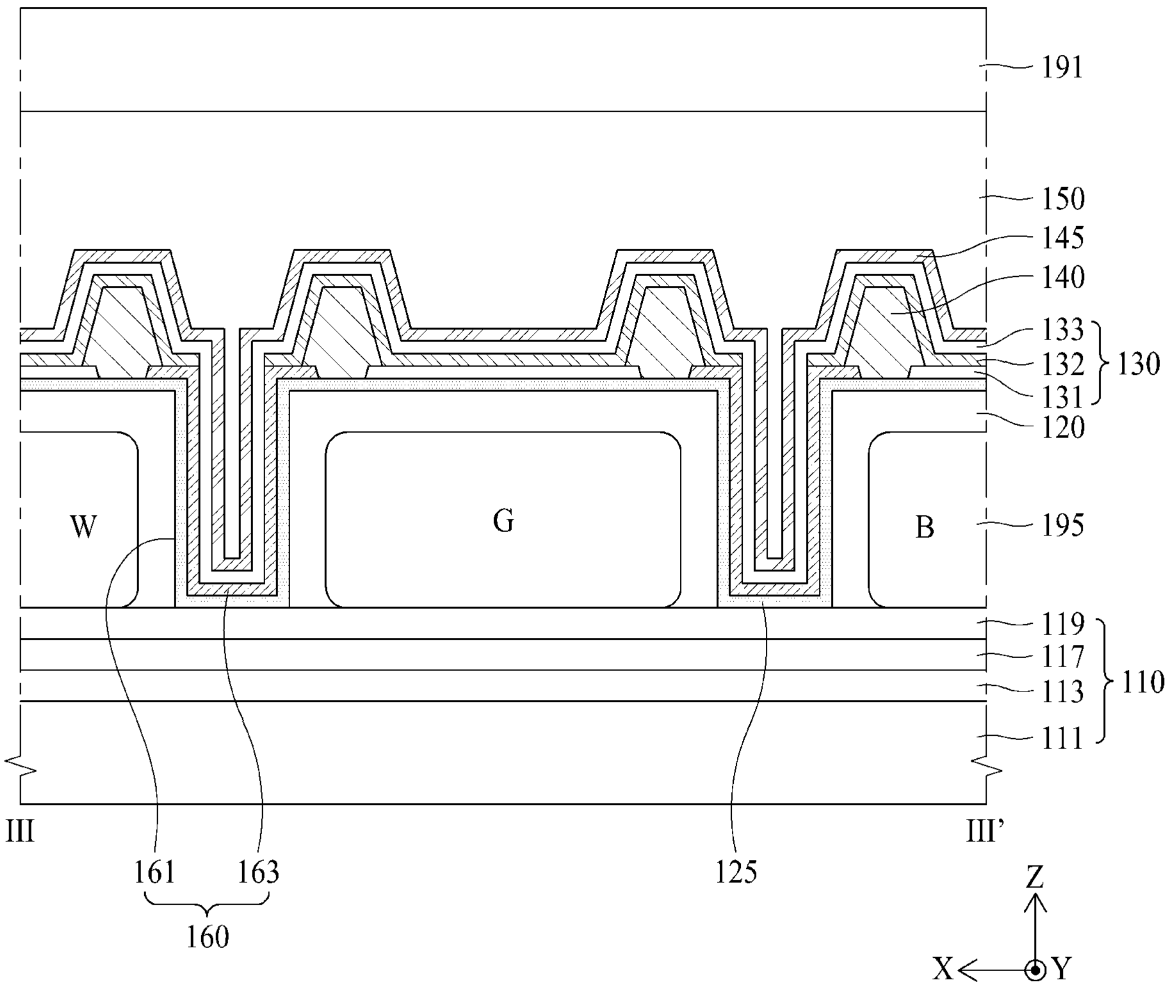
FIG. 9 is a cross-sectional view illustrating a cross-sectional surface taken along line III-III' according to another embodiment of FIG. 6.

FIG. 9 is a cross-sectional view illustrating a cross-sectional surface taken along line III-III' according to another embodiment of FIG. 6. In another embodiment of the present disclosure, a passivation layer may be additionally provided on a second electrode, and the other elements may be the same as an embodiment of the present disclosure described above with reference to FIGS. 6 to 8. Hereinafter, therefore, only different elements will be described.

Referring to FIG. 9, a light emitting display apparatus according to another embodiment of the present disclosure may further include a passivation layer 145. The passivation layer 145 may be provided on a second electrode 133. The passivation layer 145 may cover an upper surface of the second electrode 133. The passivation layer 145 may be provided along the upper surface of the second electrode 133. Therefore, the passivation layer 145 may be provided along a groove 161, on the upper surface of the second electrode 133. Therefore, the passivation layer 145 may be provided between two adjacent subpixels PX of a plurality of subpixels PX. Accordingly, the passivation layer 145 according to another embodiment of the present disclosure may additionally prevent the penetration of water or oxygen moving to each subpixel PX. For example, the passivation layer 145 may include silicon oxide or silicon nitride. A filling layer 150 may be provided between a TFT substrate 110 and a color filter substrate 190. The filling layer 150 may be provided between the passivation layer 145 and the color filter substrate 190.

In the light emitting display apparatus according to another embodiment of the present disclosure, because the passivation layer 145 is additionally provided, the penetration of water or oxygen into a light emitting device layer 130 from a lower substrate 111 may be more effectively prevented. Also, in another embodiment of the present disclosure, because the passivation layer 145 is provided along the second electrode 133, the passivation layer 145 may be provided along the groove 161 like the second electrode 133. Accordingly, when a progressive defect occurs in one subpixel PX, the diffusion of the progressive defect to an adjacent subpixel PX may be additionally prevented.

Figure 10:
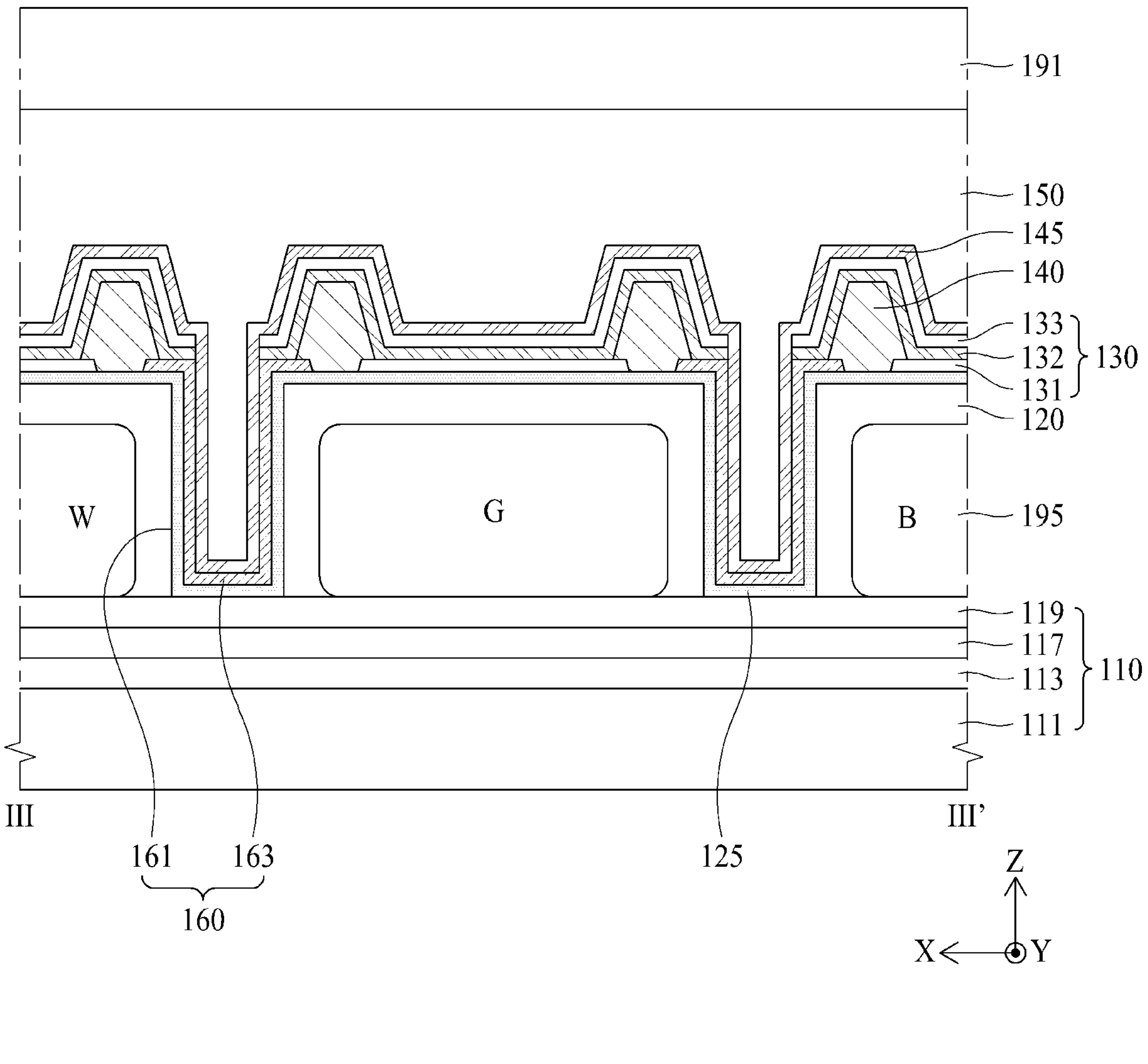
FIG. 10 is a cross-sectional view illustrating a cross-sectional surface taken along line III-III' according to another embodiment of FIG. 6.

FIG. 10 is a cross-sectional view illustrating a cross-sectional surface taken along line III-III' according to another embodiment of FIG. 6. Except for that second electrodes are apart from each other between a plurality of subpixels, another embodiment of the present disclosure may be the same as another embodiment of the present disclosure described above with reference to FIG. 9.

Referring to FIG. 10, second electrodes 133 of a light emitting display apparatus according to another embodiment of the present disclosure may be apart from each other between a plurality of subpixels PX. For example, the second electrode 133 may not be provided at a lateral surface of the groove 161. A passivation layer 145 may be provided on the second electrode 133. The passivation layer 145 may cover an upper surface of the second electrode 133. The passivation layer 145 may be provided at the lateral surface of the groove 161 where the second electrode 133 is not provided. For example, the passivation layer 145 may contact a reflection layer 163 provided in a region facing the lateral surface of the groove 161 where the second electrode 133 is not provided. Accordingly, the passivation layer 145 may be provided between two adjacent subpixels PX of the plurality of subpixels PX.

Therefore, in another embodiment of the present disclosure, because the passivation layer 145 contacts the reflection layer 163 provided in a region facing the lateral surface of the groove 161, the penetration of water or oxygen moving to each subpixel PX may be more effectively prevented. Also, in another embodiment of the present disclosure, when a progressive defect occurs in one subpixel PX, the diffusion of the progressive defect to an adjacent subpixel PX may be additionally prevented.

A light emitting display apparatus according to the present disclosure will be described below.

A light emitting display apparatus according to an embodiment of the present disclosure may include a substrate including a display area and a non-display area at a periphery of the display area, a plurality of subpixels provided in the display area, and a blocking structure provided between the plurality of subpixels to reflect light incident from an emission region of the display area and prevent penetration of water between the plurality of subpixels.

According to some embodiments of the present disclosure, the blocking structure may include at least one groove between the plurality of subpixels, and a reflection layer at a lateral surface of the at least one groove.

According to some embodiments of the present disclosure, each of the plurality of subpixels may include a thin film transistor (TFT) on the substrate, and a light emitting device layer including a first electrode connected with the TFT, an emission layer on the first electrode, and a second electrode on the emission layer, and the reflection layer does not contact the first electrode.

According to some embodiments of the present disclosure, the light emitting display apparatus may include a bank dividing an emission region of each of the plurality of subpixels, wherein the at least one groove of the blocking structure is provided at the bank.

According to some embodiments of the present disclosure, the reflection layer may cover the at least one groove.

According to some embodiments of the present disclosure, emission layers may respectively provide in adjacent subpixels of the plurality of subpixels are apart from each other.

According to some embodiments of the present disclosure, the at least one groove may be provided at a perimeter of each of the plurality of subpixels.

According to some embodiments of the present disclosure, the emission layer may cover an end of the reflection layer.

According to some embodiments of the present disclosure, the lateral surface of the at least one groove may be vertical from an upper surface of the bank.

According to some embodiments of the present disclosure, the light emitting display apparatus may further include an overcoat layer on the TFT, an anti-moisture layer on the overcoat layer, a first bank on the anti-moisture layer and at one side of each of the plurality of subpixels, and a second bank provided apart from the first bank, at the other side of each of the plurality of subpixels.

According to some embodiments of the present disclosure, the at least one groove of the blocking structure may be provided in the overcoat layer.

According to some embodiments of the present disclosure, the at least one groove of the blocking structure does not overlap the first bank and the second bank.

According to some embodiments of the present disclosure, the reflection layer may be provided on the at least one groove.

According to some embodiments of the present disclosure, the anti-moisture layer may be provided between the overcoat layer and the reflection layer.

According to some embodiments of the present disclosure, the reflection layer and the first electrode may be apart from each other on the same layer.

According to some embodiments of the present disclosure, the first bank may cover a first end of the reflection layer and a second end of the first electrode, and the second bank covers a second end, facing the first end, of the reflection layer and a first end of an adjacent first electrode of an adjacent subpixel.

According to some embodiments of the present disclosure, the first bank and the second band may be apart from each other with the at least one groove therebetween.

According to some embodiments of the present disclosure, the second electrode may cover the emission layer and the at least one groove.

According to some embodiments of the present disclosure, the light emitting display apparatus may further include a passivation layer provided on the second electrode to cover the second electrode.

According to some embodiments of the present disclosure, the second electrode may contact a lateral surface or an upper surface of the reflection layer.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus, comprising:

a substrate including a display area and a non-display area at a periphery of the display area;

a plurality of subpixels provided in the display area; and a blocking structure provided between the plurality of subpixels to reflect light incident from an emission region of the display area and prevent penetration of water between the plurality of subpixels, wherein the blocking structure comprises:

at least one groove between the plurality of subpixels; and a reflection layer at a lateral surface of the at least one groove.

2. The light emitting display apparatus of claim 1, wherein each of the plurality of subpixels comprises:

a thin film transistor (TFT) on the substrate; and a light emitting device layer including a first electrode connected with the TFT, an emission layer on the first electrode, and a second electrode on the emission layer, and wherein the reflection layer does not contact the first electrode.

3. The light emitting display apparatus of claim 2, further comprising a bank dividing an emission region of each of the plurality of subpixels, wherein the at least one groove of the blocking structure is provided at the bank.

4. The light emitting display apparatus of claim 2, wherein the reflection layer covers the at least one groove.

5. The light emitting display apparatus of claim 2, wherein emission layers respectively provided in adjacent subpixels of the plurality of subpixels are apart from each other.

6. The light emitting display apparatus of claim 1, wherein the at least one groove is provided at a perimeter of each of the plurality of subpixels.

7. The light emitting display apparatus of claim 2, wherein the emission layer covers an end of the reflection layer.

8. The light emitting display apparatus of claim 3, wherein the lateral surface of the at least one groove is vertical from an upper surface of the bank.

9. The light emitting display apparatus of claim 2, further comprising:

an overcoat layer on the TFT;

an anti-moisture layer on the overcoat layer;

a first bank on the anti-moisture layer and at one side of each of the plurality of subpixels; and a second bank provided apart from the first bank, at the other side of each of the plurality of subpixels.

10. The light emitting display apparatus of claim 9, wherein the at least one groove of the blocking structure is provided in the overcoat layer.

11. The light emitting display apparatus of claim 10, wherein the at least one groove of the blocking structure does not overlap the first bank and the second bank.

12. The light emitting display apparatus of claim 11, wherein the reflection layer is provided on the at least one groove.

13. The light emitting display apparatus of claim 9, wherein the anti-moisture layer is provided between the overcoat layer and the reflection layer.

14. The light emitting display apparatus of claim 9, wherein the reflection layer and the first electrode are apart from each other on a same layer.

15. The light emitting display apparatus of claim 9, wherein the first bank covers a first end of the reflection layer and a second end of the first electrode, and the second bank covers a second end, facing the first end, of the reflection layer and a first end of an adjacent first electrode of an adjacent subpixel.

16. The light emitting display apparatus of claim 15, wherein the first bank and the second bank are apart from each other with the at least one groove therebetween.

17. The light emitting display apparatus of claim 9, wherein the second electrode covers the emission layer and the at least one groove.

18. The light emitting display apparatus of claim 17, further comprising a passivation layer provided on the second electrode to cover the second electrode.

19. The light emitting display apparatus of claim 17, wherein the passivation layer contacts the reflection layer provided in a region facing the lateral surface of the at least one groove.

20. The light emitting display apparatus of claim 2, wherein the second electrode contacts a lateral surface or an upper surface of the reflection layer.

* * * * *